(12) United States Patent
Dasgupta et al.

(10) Patent No.: US 10,921,028 B2
(45) Date of Patent: Feb. 16, 2021

(54) SOLAR STRUCTURE

(71) Applicant: International Business Machines Corporation, Armonk, NY (US)

(72) Inventors: Kalyan Kanti Dasgupta, Bangalore (IN); Manikandan Padmanaban, Bangalore (IN); Jagabondhu Hazra, Bangalore (IN); Amar Prakash Azad, Bangalore (IN); Shivkumar Kalyanaraman, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 137 days.

(21) Appl. No.: 15/891,913

(22) Filed: Feb. 8, 2018

(65) Prior Publication Data

US 2019/0242621 A1 Aug. 8, 2019

(51) Int. Cl.
| | |
|---|---|
| *H01L 31/042* | (2014.01) |
| *H02N 6/00* | (2006.01) |
| *F24S 50/20* | (2018.01) |
| *H01L 31/054* | (2014.01) |
| *H02S 50/00* | (2014.01) |
| *G05F 1/67* | (2006.01) |

(52) U.S. Cl.
CPC ............. *F24S 50/20* (2018.05); *G05F 1/67* (2013.01); *H01L 31/0547* (2014.12); *H02S 50/00* (2013.01); *F24S 2050/25* (2018.05)

(58) Field of Classification Search
CPC .. F24S 50/20; G05F 1/67; H02S 50/00; H01L 31/0547; H01L 31/05; H01L 31/02016
See application file for complete search history.

(56) References Cited

U.S. PATENT DOCUMENTS

| | | | |
|---|---|---|---|
| 9,105,538 | B2 | 8/2015 | Kim |
| 9,654,053 | B2 | 5/2017 | Panish |

(Continued)

OTHER PUBLICATIONS

Storey et al., "The Optimized-String Dynamic Photovoltaic Array," IEEE Transactions on Power Electronics, vol. 29, No. 4, Apr. 2014, p. 1768 (Year: 2014).*

(Continued)

*Primary Examiner* — Angelo Trivisonno
(74) *Attorney, Agent, or Firm* — Ference & Associates LLC (57) ABSTRACT

One embodiment provides a method, including: receiving configuration input for a solar structure; the configuration input comprising (i) a geographical location, (ii) module configuration input, and (iii) reflector configuration input; identifying the position of the sun; determining an angle between the solar reflector and the solar module corresponding to a predetermined power gain for the solar module, wherein the determining comprises (i) identifying the corresponding area of the solar module that is illuminated by the solar reflector and (ii) totaling the contributions from each of the solar reflectors to calculate an irradiance for each solar cell; adjusting the angles of at least some of the solar reflectors with respect to the solar module to angles determined to correspond to the predetermined power gain using at least one actuator; and dynamically changing how the solar cells are electrically connected together to form a plurality of strings.

20 Claims, 5 Drawing Sheets

(56) References Cited

U.S. PATENT DOCUMENTS

| | | | |
|---|---|---|---|
| 2009/0151769 A1* | 6/2009 | Corbin | H02S 40/22 |
| | | | 136/246 |
| 2009/0194146 A1 | 8/2009 | Simon | |
| 2015/0114444 A1* | 4/2015 | Lentine | H01L 31/05 |
| | | | 136/244 |
| 2016/0254781 A1 | 9/2016 | Pisharodi | |
| 2017/0033733 A1 | 2/2017 | Chandan et al. | |
| 2017/0187322 A1 | 6/2017 | Pisharodi | |

OTHER PUBLICATIONS

Wijesuriya et al., "A Novel Mathematical Model to Improve the Power Output of a Solar Panel Using Reflectors," 2016 Electrical Engineering Conference (EECon), p. 97 (Year: 2016).*

Belhadj, Mohammed et al., "Modeling of Automatic Reflectors for PV panel Attached to Commercial PV/T Module", International Journal of Applied Engineering Research, ISSN 0973-4562, 2016, pp. 11309-11314, 6 pages, vol. 11, No. 23, Research India Publications.

Singh, Nitin et al., "Photonic Energy Harvesting: Boosting Energy Yield of Commodity Solar Photovoltaic Systems via Software Defined IoT Controls", e-Energy '17, May 16-19, 2017, Shatin, Hong Kong, 11 pages, ACM Digital Library.

Wijesuriya, D.T.P. et al., "A Novel Mathematical Model to Improve the Power Output of a Solar Panel Using Reflectors", 2016, 6 pages, IEEE Digital Library.

Storey, Jonathan et al., "The Optimized-String Dynamic Photovoltaic Array", IEEE Transactions on Power Electronics, Apr. 2014, 9 pages, vol. 29, No. 4, IEEE Digital Library.

* cited by examiner

SOLAR STRUCTURE

BACKGROUND

The world has significant energy needs. Energy is used to power everything from clocks and mobile devices to cars and buildings. Some energy needs are met through the use of energy storage devices, for example, batteries, accumulators, and the like. Other energy needs are met through the use of produced energy which is then directed to the power grid that is accessible by different energy consumers (e.g., homes, businesses, facilities, etc.). The energy needs for consumers varies throughout the day and night, and energy needs may be greater or less than what the power grid can provide. The energy providers adjust to this difference in demand by either increasing or by reducing the energy supplied to the power grid. One way to increase/reduce the energy supplied to the grid is to increase/decrease the amount of energy produced by energy producers (e.g., non-renewable energy power plants, renewable energy power producers, etc.).

During the day and night, the demand for energy can fluctuate, sometimes very quickly. Accordingly, the power plants are divided into base load power plants and peak load power plants. Base load power plants generally maintain a constant energy output that satisfies a minimum amount of energy demand. Typically, base load power plants are plants that have a constant energy supply, for example, nuclear power plants, coal power plants, and the like. The peak load power plants generally supply energy when there is a high demand for energy. Thus, peak load power plants are energy producers that are able to be stopped and started quickly. Additionally, power plants which do not have a constant energy supply (e.g., solar power, wind power, etc.) are typically used as peak load power plants, rather than base load power plants.

BRIEF SUMMARY

In summary, one aspect of the invention provides a method, comprising: receiving configuration input for a solar structure comprising (i) a solar module and (ii) a reflector array located around the periphery of the solar module, wherein the reflector array comprises a plurality of solar reflectors whose orientation with respect to the solar module can be changed; the configuration input comprising (i) a geographical location of the solar structure, (ii) module configuration input specifying dimensions of the solar module and the number of solar cells within the solar module, and (iii) reflector configuration input identifying the number of solar reflectors within the reflector array and dimensions of each of the solar reflectors; identifying the position of the sun relative to the solar structure; determining, for each solar reflector and based upon the identified position of the sun and the configuration input, an angle between the solar reflector and the solar module corresponding to a predetermined power gain for the solar module, wherein the determining comprises (i) for each of the solar reflectors, identifying the corresponding area of the solar module that is illuminated by the solar reflector and (ii) totaling the contributions from each of the solar reflectors to calculate an irradiance for each solar cell; adjusting the angles of at least some of the solar reflectors with respect to the solar module to angles determined to correspond to the predetermined power gain using at least one actuator, coupled to each solar reflector, that provides actuation of the solar reflector in a direction fore and aft with respect to the solar module; and dynamically changing, responsive to adjusting the at least some of the solar reflectors and based upon calculating the irradiance for each solar cell, how the solar cells are electrically connected together to form a plurality of strings, so that each of the solar cells connected together within a given string has an irradiance similar to that of other cells within the given string.

Another aspect of the invention provides an apparatus, comprising: at least one processor; and a computer readable storage medium having computer readable program code embodied therewith and executable by the at least one processor, the computer readable program code comprising: computer readable program code configured to receive configuration input for a solar structure comprising (i) a solar module and (ii) a reflector array located around the periphery of the solar module, wherein the reflector array comprises a plurality of solar reflectors whose orientation with respect to the solar module can be changed; the configuration input comprising (i) a geographical location of the solar structure, (ii) module configuration input specifying dimensions of the solar module and the number of solar cells within the solar module, and (iii) reflector configuration input identifying the number of solar reflectors within the reflector array and dimensions of each of the solar reflectors; computer readable program code configured to identify the position of the sun relative to the solar structure; computer readable program code configured to determine, for each solar reflector and based upon the identified position of the sun and the configuration input, an angle between the solar reflector and the solar module corresponding to a predetermined power gain for the solar module, wherein the determining comprises (i) for each of the solar reflectors, identifying the corresponding area of the solar module that is illuminated by the solar reflector and (ii) totaling the contributions from each of the solar reflectors to calculate an irradiance for each solar cell; computer readable program code configured to adjust the angles of at least some of the solar reflectors with respect to the solar module to angles determined to correspond to the predetermined power gain using at least one actuator, coupled to each solar reflector, that provides actuation of the solar reflector in a direction fore and aft with respect to the solar module; and computer readable program code configured to dynamically change, responsive to adjusting the at least some of the solar reflectors and based upon calculating the irradiance for each solar cell, how the solar cells are electrically connected together to form a plurality of strings, so that each of the solar cells connected together within a given string has an irradiance similar to that of other cells within the given string.

An additional aspect of the invention provides a computer program product, comprising: a computer readable storage medium having computer readable program code embodied therewith, the computer readable program code executable by a processor and comprising: computer readable program code configured to receive configuration input for a solar structure comprising (i) a solar module and (ii) a reflector array located around the periphery of the solar module, wherein the reflector array comprises a plurality of solar reflectors whose orientation with respect to the solar module can be changed; the configuration input comprising (i) a geographical location of the solar structure, (ii) module configuration input specifying dimensions of the solar module and the number of solar cells within the solar module, and (iii) reflector configuration input identifying the number of solar reflectors within the reflector array and dimensions of each of the solar reflectors; computer readable program code configured to identify the position of the sun relative to the solar structure; computer readable program code configured to determine, for each solar reflector and based upon the identified position of the sun and the configuration input, an angle between the solar reflector and the solar module corresponding to a predetermined power gain for the solar module, wherein the determining comprises (i) for each of the solar reflectors, identifying the corresponding area of the solar module that is illuminated by the solar reflector and (ii) totaling the contributions from each of the solar reflectors to calculate an irradiance for each solar cell; computer readable program code configured to adjust the angles of at least some of the solar reflectors with respect to the solar module to angles determined to correspond to the predetermined power gain using at least one actuator, coupled to each solar reflector, that provides actuation of the solar reflector in a direction fore and aft with respect to the solar module; and computer readable program code configured to dynamically change, responsive to adjusting the at least some of the solar reflectors and based upon calculating the irradiance for each solar cell, how the solar cells are electrically connected together to form a plurality of strings, so that each of the solar cells connected together within a given string has an irradiance similar to that of other cells within the given string.

A further aspect of the invention provides a method, comprising: determining an angle for each of a plurality of solar reflectors with respect to a solar module comprising a plurality of cells, wherein the plurality of solar reflectors are arranged around the periphery of the solar module, wherein the determined angle for each solar reflector corresponds to a predetermined harvested irradiance for each cell; the determining comprising determining a harvested irradiance for each cell (i) identifying the corresponding area of the solar module that is illuminated by each solar reflector, (ii) identifying the cells illuminated by the corresponding area, and (iii) calculating, for each cell, a reflected irradiance by totaling the irradiance contributions from each solar reflector; and dynamically adjusting, responsive to determining the harvested irradiance for each cell, how the cells are electrically connected together to form a plurality of strings, so that each of the cells in a given string has a reflected irradiance similar to that of other cells within the given string, wherein the dynamically adjusting comprises determining a number of strings to be used in the solar module (i) not exceeding a maximum number of strings and (ii) not less than a minimum number of strings.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The illustrated embodiments of the invention will be best understood by reference to the figures. The following description is intended only by way of example and simply illustrates certain selected exemplary embodiments of the invention as claimed herein. It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Specific reference will be made here below to FIGS. 1-5. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12' in FIG. 5. In accordance with an example embodiment, all of the process steps, components and outputs discussed with respect to FIGS. 1-4 can be performed or utilized by way of a processing unit or units and system memory such as those indicated, respectively, at 16' and 28' in FIG. 5, whether on a server computer, a client computer, a node computer in a distributed network, or any combination thereof.

The increase in a desire to decrease the carbon footprint and decrease pollution, especially as produced by energy generation facilities, has made renewable energy sources (e.g., wind, water, solar, etc.) crucial. Particularly, renewable energy sources (e.g., wind, water, solar, etc.) are widely regarded as being important to the future of energy generation. However, due to the instability and volatility of some renewable energy sources, the power generation plants using those energy sources may only be used to assist in meeting peak demand loads. Additionally, since the power production of these renewable energy sources is directly dependent on an uncontrollable force (e.g., sunlight, wind, waves, etc.), it may be difficult to ensure maximum production and to consistently produce a requested power output.

In order to account for this volatility the power generation from an energy producer using renewable energy sources may be curtailed, meaning that the requested output power will be less than the actual amount of power that can be produced by the facility. Such a technique helps to ensure that the forecasted amount of power needed by the power grid will be able to be met using all energy producers within the power grid. However, one problem with this solution is that any excess energy produced by the facility will be wasted or may be stored in on-site energy storage facilities, which increases the reliance on the non-renewable energy producers. An additional problem is that produced energy ends up being wasted.

Since the production of solar energy is directly dependent on the amount of sunlight, a solar energy system may experience sharp and quick increases and decreases in the amount of energy that can be generated. For example, photovoltaic output may drop by 80% within a few seconds. Such sudden and dramatic increases and decreases can impact the electromechanical dynamics of the system which may create severe frequency oscillations. This may lead to malfunctions of the protections systems and may trigger cascading failures or massive blackouts.

A solar energy generation system may also suffer from mid-term volatility where the solar photovoltaic output may change over the course of a few minutes to a few hours. For example, the photovoltaic output may change due to cloud movements or temporary shadow effects. For example, during cloud cover the sunlight received by the photovoltaic panels is dramatically reduced as compared to when there is no cloud cover. Additionally, the amount of sunlight received by the photovoltaic panels varies throughout the day due to the different angles at which the sunlight hits the photovoltaic panels. At different angles the sun hits the photovoltaic panels less directly and therefore the amount of irradiance received by the surface of the photovoltaic panel varies. Irradiance is the radiant flux, or power, received by a surface per unit area. Each photovoltaic panel has an optimal angle and orientation that most efficiently utilizes the irradiance. However, this angle and orientation vary as the sun angle varies throughout the day. The mid-term volatility impacts the load following capability of the grid and increases the required spinning reserve capacity. It can also create huge power swings in the grid which may lead to voltage collapse.

A solar energy generation system may also suffer from long term volatility. The amount of sunlight that will be available, and thus the amount of photovoltaic output that is possible, can be difficult to predict. Since energy providers need to bid in real time as well as for future energy generation (e.g., a day ahead, a week ahead, etc.), it can be difficult to accurately predict the amount of photovoltaic output that will be produced by the facility. If the energy generation facility is unable to meet the bid commitment, the facility may need to pay high penalties.

One technique for reducing the effect of the volatility of the solar energy production is to make the power production from the solar modules more stable, specifically by increasing the production of the solar modules to a maximum output value. In an effort to increase production, reflectors have been added to the solar modules. The reflectors can then be controlled to reflect sunlight onto the solar modules, thereby increasing the fraction of the solar module that receives sunlight, particularly when the angle of the sun is such that portions of the module may not receive the sunlight without the reflector. However, there are some problems with the current reflector additions.

Typically solar modules are rectangular. Therefore, the reflectors that are added to the solar modules are added, at most, to two opposing sides of the solar module. The problem with such reflectors is that as the light is reflected from the reflector to the solar module, the reflection does not cover the entire solar module and some of the reflected light is wasted reflected light that is reflected onto the ground. Specifically, the reflectors suffer from the azimuth effect, where the reflected light is reflected at an angle from the solar module, thereby resulting in solar panels within the module receiving partial or no illumination. In other words, the azimuth effect is the effect caused by the reflection of the sun being oblique in orientation, thereby preventing some of the solar module from receiving any reflected light and some of the reflected light to be wasted (e.g., being directed to the ground). Depending on the configuration of the reflectors, the reflected irradiance loss may be 25% or more. Thus, the traditional rectangular reflectors are designed to be longer than the solar module so that the entire solar module is illuminated. However, this results in not only increased production costs of the reflectors, but also in wasted reflected light.

Additionally, the surface area of the solar module that is non-illuminated or partially illuminated varies as the angle of the sun changes. Accordingly, the reflectors cannot be positioned in such a manner that will result in the entirety of the solar module being illuminated at all times. One technique to solve this problem is to put the reflectors on track systems or other devices that allow the reflector to be moved or adjusted throughout the day as the sun angle changes. However, this only allows the reflection from the reflector to be moved from one location to another, but does not eliminate the azimuth effect.

Another problem with traditional reflectors is that since the reflectors are on opposing sides of the solar module, the reflectors are either oriented towards the East-West or North-South direction. This results in a limitation on the minimum angle that the normal of the reflector surface can make with the incident sun rays from the sun. In other words, once the sun reaches a particular position in the sky, the angle of the light with respect to the reflector is such that the reflector is no longer able to "catch" the light and reflect it onto the solar module.

Accordingly, the techniques and systems as described herein provide a system and technique for optimizing or maximizing the power output of a solar structure by using a solar structure whose face is non-rectangular. The terms "reflector" and "photonic harvester" will be used interchangeably throughout this disclosure. The reflector or photonic harvester will be described in more detail below, but includes a portion of the overall system that does not collect solar energy to be converted to power as with a solar module or solar panel, but instead reflects sunlight from one position to another position, for example, onto the solar module. The term solar module will be used herein to refer to a configuration or module that is made up of a plurality of solar panels or solar cells. The term solar structure will be used herein to refer to the solar module including the solar reflectors and any other hardware attached to the solar structure.

The solar structure, whose face is non-rectangular, includes a solar module and an array of solar reflectors where the solar reflectors within the solar reflector array are arranged around the solar module in a non-rectangular configuration, for example, in a circular or circular-type (hexagonal, octagonal, etc.) configuration. The system may receive configuration input for the non-rectangular solar structure that includes structure configuration input, module configuration input, and reflector configuration input. The structure configuration input may include a geographical location of the solar structure. The module configuration input may include a dimension of the solar module, number of cells within the solar module, and the like. The reflector configuration input may include dimensions of the reflectors, a number of reflectors, the position of each reflector with respect to the solar module, and the like.

Using the configuration input and a position of the sun with respect to the solar structure, the system may determine an optimal angle for each of the solar reflectors with respect to the solar module. This optimal angle may be an angle that results in a predetermined energy gain, for example, the maximum energy gain, an energy gain specified by a user, or the like. The determination of the optimal angle may be based on identifying an area of the reflection profile for each of the solar reflectors, calculating the harvested irradiance power for each reflector, and then calculating the irradiance profile for the solar module based upon the calculated harvested irradiance power for each reflector. The system then adjusts, using one or more actuators coupled to the reflector, any reflectors that are not at the identified optimal angle.

The system may also dynamically cluster cells of the solar module into a plurality of strings based upon the irradiance level for each cell. The system may determine which cells have a similar irradiance level and then electrically connect these cells together using switching circuits. The number of strings within the solar module is bounded by a minimum number and a maximum number. The minimum number of strings is based upon a maximum allowable voltage of the DC/DC converter of the string. In other words, each cell within the string requires a particular DC voltage. By connecting these cells together in series, the DC voltage required by the series of cells increases. Therefore, a maximum number of cells can be electrically connected together as determined by the maximum allowable voltage of the DC/DC converter. Thus, the minimum number of strings for the entire solar module is defined by this same parameter.

The maximum number of strings within the solar module is based upon a desire to decrease the amount, and, therefore, the cost, of hardware required to control each string. In other words, each string has a hardware requirement. If every cell in the solar module was independent from each other cell, the number of hardware components would increase to an unfeasible number. Therefore, a statistical maximum number of strings can be identified by determining a statistical irradiance profile for the geographical location, identifying a variance of the statistical irradiance profile, and determining a number of strings that are needed to account for the variance. In other words, using a statistical analysis, a user can compute a typical number of strings that will be required to provide for any variance in irradiance that will be experienced by the solar module.

Such a system provides a technical improvement over current solar harvesting systems. The systems and methods described herein provide a system and technique for arranging a solar structure having a face that is non-rectangular, determining an optimal angle for each reflector of the solar structure, and dynamically configuring strings within the solar module that allows for electrical connection of cells within the solar module that have similar power output values. By arranging the solar reflectors and solar module in a non-rectangular configuration, for example, a circular or circular-type (hexagonal, octagonal, etc.) shape, the sunlight reflected from the reflectors is reflected onto the solar module, rather than onto the ground, thereby reducing wasted reflected light. Additionally, because of the orientation of the reflectors with respect to the solar module, no matter the dimensions of the reflector, all reflected light from the reflector will fall onto the solar module. Also, due to the orientation of the reflectors with respect to the solar module, the reflectors of the system as described herein can provide a minimum angle that is much less than the minimum angle of traditional systems. The systems and methods as described herein also provide a technique for dynamically changing the angle of the reflector with respect to the solar module and also for dynamically changing the cells of the solar module that are connected via a string as the sun changes positions with respect to the solar structure. In other words, the angle of the reflectors and the strings can be dynamically modified in real-time as the sun moves.

Figure 1:
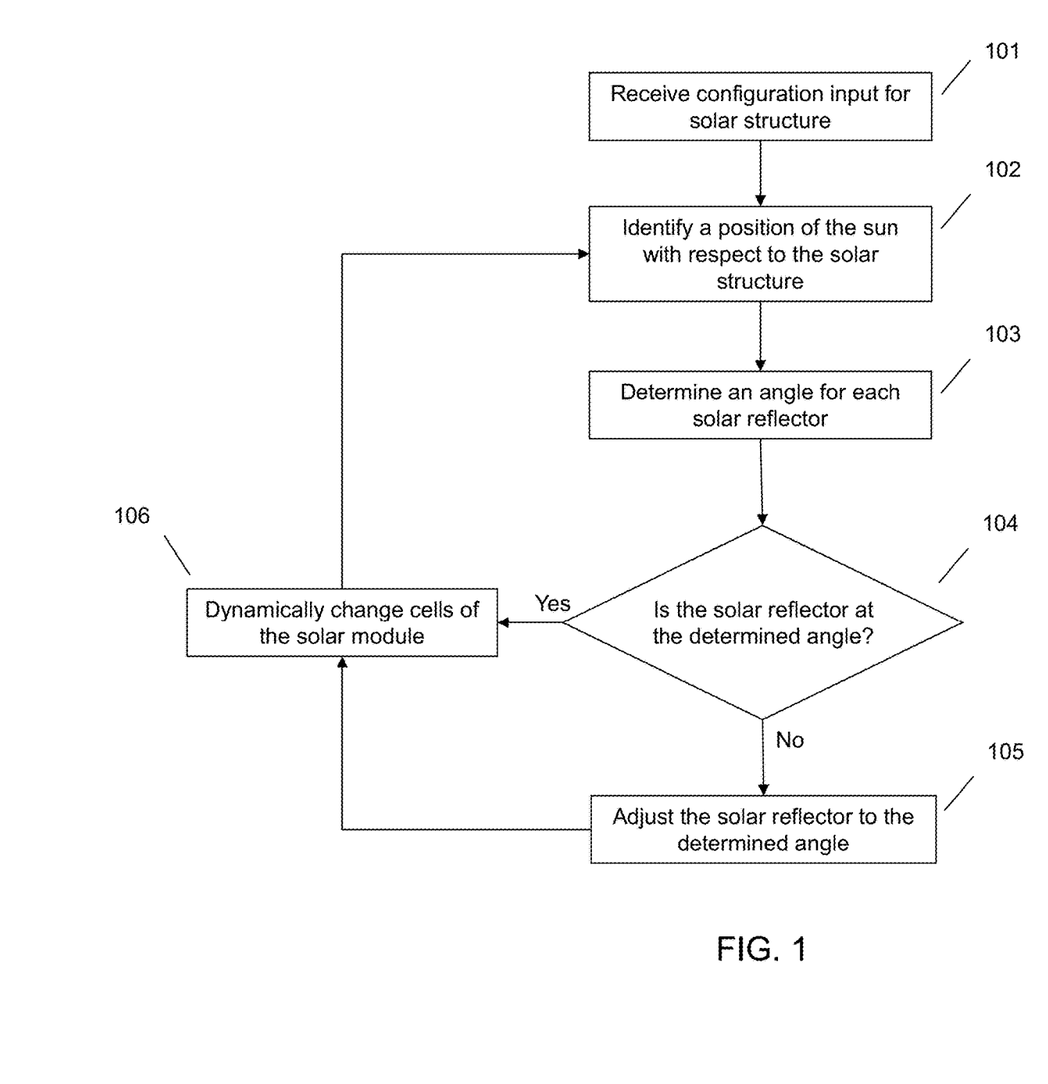
FIG. 1 illustrates a method of optimizing power output of a solar module using a solar structure whose face is non-rectangular.
Figure 2:
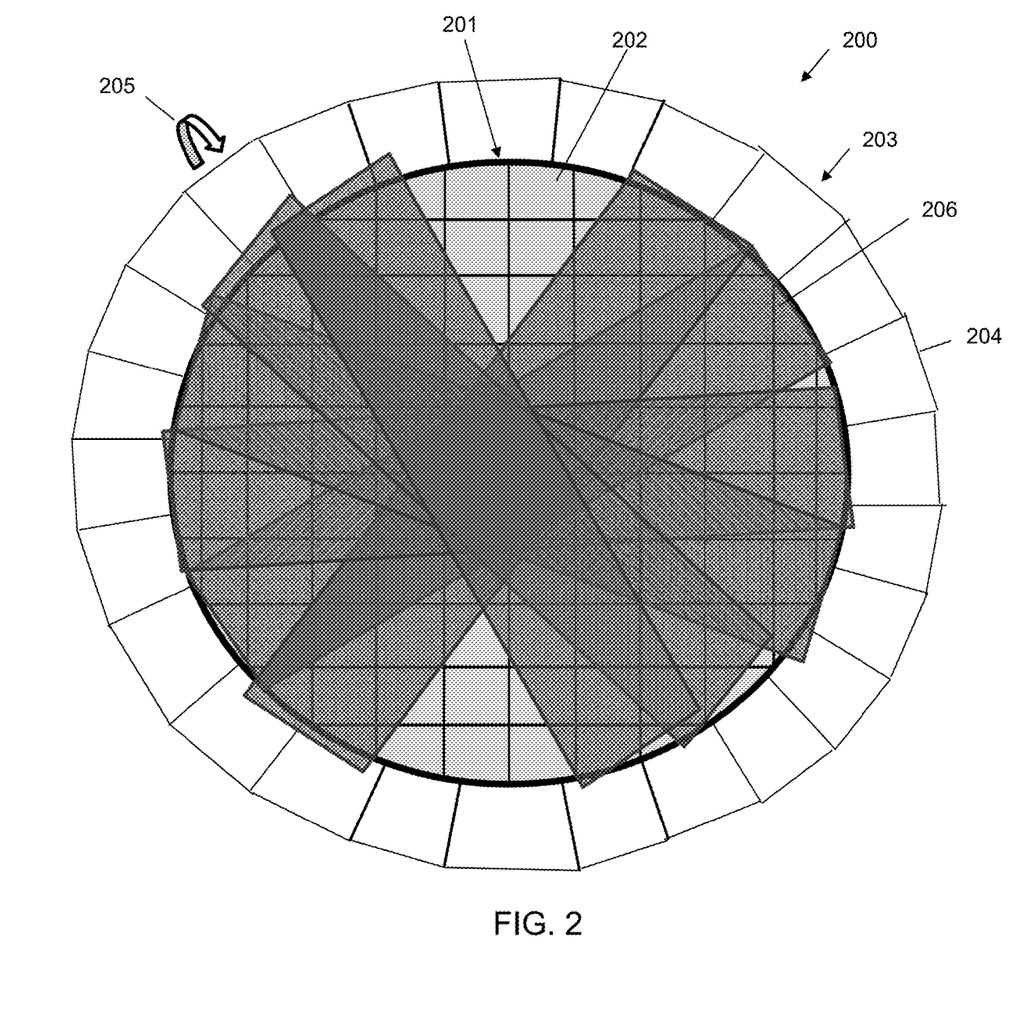
FIG. 2 illustrates an example solar structure whose face is non-rectangular.

FIG. 1 illustrates a method for optimizing power output of a solar module using a solar structure having a non-rectangular face. The term "non-rectangular solar structure" will be used here throughout to refer to a solar structure having a non-rectangular face. In other words, a non-rectangular solar structure refers to a solar structure in which the reflector array is arranged around the solar module in a non-rectangular configuration. A non-rectangular solar structure may also have a solar module face that is non-rectangular. An example solar structure having a non-rectangular face is illustrated in FIG. 2. The non-rectangular solar structure illustrated in FIG. 2 is a circular solar structure. However, the solar structure may be different circular-type shapes, for example, the solar structure may be hexagonal, octagonal, or the like. Each structure shape may have benefits over a different structure shape. For example, a circular structure shape provides the highest degree of freedom with respect to the orientation of the reflector with respect to the solar module. However, a circular-type shape having straight sides (e.g., hexagonal, octagonal, pentagonal, etc.) may provide an improved ground coverage ratio when compared to the circular shape since the solar structures can be put closer together with less unused space between the structures.

The non-rectangular solar structure 200 may include a solar module 201 having a plurality of solar cells 202 and a reflector array 203 having one or more solar reflectors 204. Each of the reflectors may be a flat, rectangular, reflector, but may have different dimensions than other reflectors within the reflector array. The reflectors may also be other shapes, for example, trapezoidal, parallelogram, or the like. While a full reflector array is illustrated in FIG. 2, it should be understood that the reflector array may not be a full array. In other words, a full array is a reflector array where each reflector is right next to two other reflectors, one on each side, with no gap between the reflectors. However, depending on the location of the solar structure, it may be advantageous to have solar structures with gaps between the reflectors, sides of the solar structure that do not have any reflectors at all (e.g., the reflectors are only positioned on the north side of the structure and no reflectors are on the south side, etc.), reflector arrays having unequal spacing between the reflectors, or the like. Each of the reflectors, when positioned to reflect sunlight onto the solar module, will produce a reflection profile 206 onto the solar module.

The solar structure may also include additional hardware components. Additional hardware may include actuators for actuating each of the reflectors independently from other reflectors within the array. In other words, each reflector may include one or more actuators that allow actuation of the reflector in a direction fore and aft 205 with respect to the solar module. In other words, the axis of rotation of the reflector with respect to the solar module forms a tangent to the circle. The additional hardware may also include hardware for connecting cells of the solar module together in strings, for example, DC/DC converters, maximum power point tracking (MPPT) modules, switching circuitry, and the like.

At 101 the system may receive configuration input for the non-rectangular solar structure. The configuration input may include information related to the solar structure itself, for example, a geographical location of the solar structure (e.g., global positioning system (GPS) coordinates, latitude/longitude location, location name, etc.), an orientation of the solar structure (e.g., angle of incline, location with respect to nearby structures, etc.), and the like. The configuration input may also include module configuration input that is related to the solar module component of the solar structure. The module configuration input may include an identification of a number of solar cells within the solar module, a dimension of the solar module (e.g., radius, circumference, size, etc.), location of the cells within the solar module, and the like. The configuration input may also include reflector configuration input related to the reflector array. The reflector configuration input may include a number of reflectors within the reflector array, dimensions of each of the reflectors (e.g., height, linear length, etc.), a position of the reflector within the reflector array, a position of the reflector with respect to the solar module, a total area of the reflector array, and the like.

At 102 the system may receive input or otherwise identify a position of the sun with respect to the solar structure. For example, the system may identify the location of the sun in the sky and an angle of the sun with respect to the solar structure. Identifying the position of the sun may include receiving input regarding the current time of day, the current year, the current month, and the like. From this information, the system may identify the position of the sun in the sky. Alternatively, the system may identify the location of the sun using one or more sensors either attached or coupled to the solar structure itself or attached or coupled to a location near the solar structure. For example, the system may include one or more image capture devices that can take images of the sun and, using these images, identify a location of the sun in the sky with respect to the solar structure.

The system may also determine the angle of the sun with respect to the solar structure, thereby allowing determination of the incident of the sun ray. Since the angle of the sun ray hitting each of the reflectors will be different for each reflector, due to the orientation of the reflector, determining the incident of the sun ray may be performed for every reflector within the reflector array. The determination may also be performed for a group of reflectors, for example, the system may determine that a group of closely located reflectors may all have the same angle. Therefore, the system may perform the determination for the reflectors within the group as a single calculation or group.

At 103 the system may determine an optimal angle for each solar reflector within the reflector array with respect to the solar module that results in a predetermined energy gain for the solar module. In other words, the system may calculate what angle the reflector should be positioned at with respect to the solar module to result in the desired energy gain. For example, if the desired energy gain is a maximum possible energy gain, the system may determine the optimal angle for the solar reflector that would produce the maximum energy gain. As should be understood, the angle for each reflector may be different from every other reflector due to the angle of the sun rays with respect to the reflector.

To determine the angle for each reflector, the system must determine what angle will result in the desired harvested irradiance. Thus, the system determines the value for reflected irradiance caused by the reflector piece. The system also determines the area (e.g., length, width, etc.) of the reflection profile produced by the reflector. The reflection profile includes not only the location of the reflected light, but also the energy density of the reflected profile. Based upon this reflection profile, the system determines what area of the solar module is covered by the reflection profile. This determination may also include identifying the specific cells within the solar module that are covered by the reflection profile. The harvested irradiance power can then be determined by multiplying the reflected irradiance by the quotient of the area of the reflection profile divided by the area covered by the profile in the module.

The system may then calculate the irradiance profile for the solar module. The irradiance profile for the solar module identifies the harvested irradiance profile for each cell within the solar module. To determine the harvested irradiance power for each cell in the solar module, the system adds the irradiance power values generated by each reflector that has a reflector profile including the target cell. In other words, the system identifies which reflectors create a reflection profile that includes the cell and then sums the irradiance value created by those reflectors within that cell. The harvested irradiance power for cell may also include an ambient irradiance power. Using the calculated irradiance profile, the system can determine what angle each of the reflectors needs to be positioned in order to achieve the desired energy gain.

Once the angle for the reflector has been determined, the system determines, at 104, whether the reflector is at the determined angle. This determination may simply be a comparison between the current angle of the reflector and the determined angle of the reflector. If, at 104, the reflector is not at the determined angle, the system may adjust the reflector to the determined angle at 105. The adjustment may be completed using the one or more actuators that provide actuation of the solar reflection in a direction fore and aft with respect to the solar module. Since an angle of the reflector that results in a predetermined energy gain can change as the sun moves through the sky, the system can perform the calculation and movement of the reflectors to the appropriate angle in real-time. In other words, the system as described herein is a dynamic system that can respond to changes in the sun position in real-time or as the angle of the sun rays change with respect to the reflectors.

If, at 104, the reflector is already at the determined angle, or after the reflector has been moved to the determined angle, the system, at 105, dynamically clusters the cells of the solar module into a plurality of strings. Clustering cells into a string includes electrically connecting cells of the solar module together. In other words, a string is a set of solar cells that are electrically connected together in series and also electrically connected to a set of hardware for each string. The string hardware controls the string, provides necessary circuits to the string, and "collects" the power produced by the string. Collecting power includes providing an ending point that allows the conversion of the power produced by each cell into a storable or usable power. The string hardware includes DC/DC converters, MPPT modules, and the like.

Figure 3:
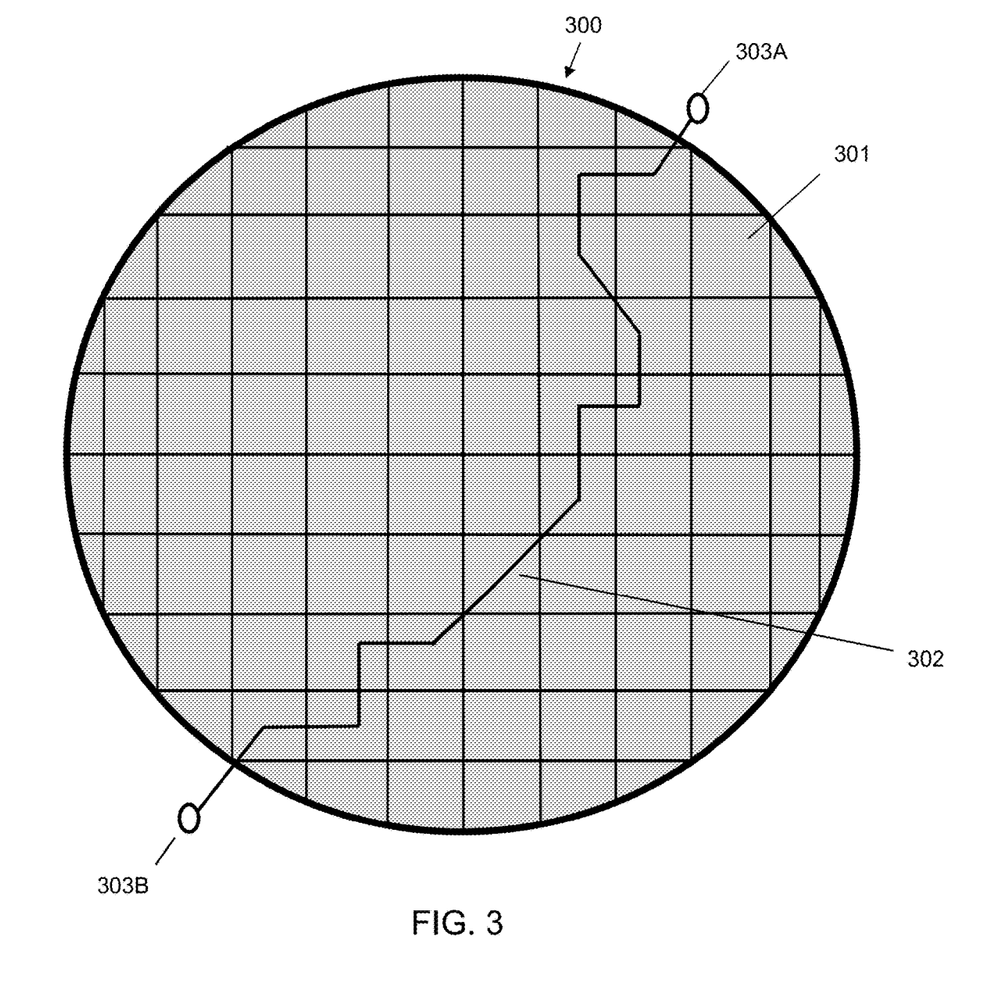
FIG. 3 illustrates an example solar cell string path.
Figure 4:
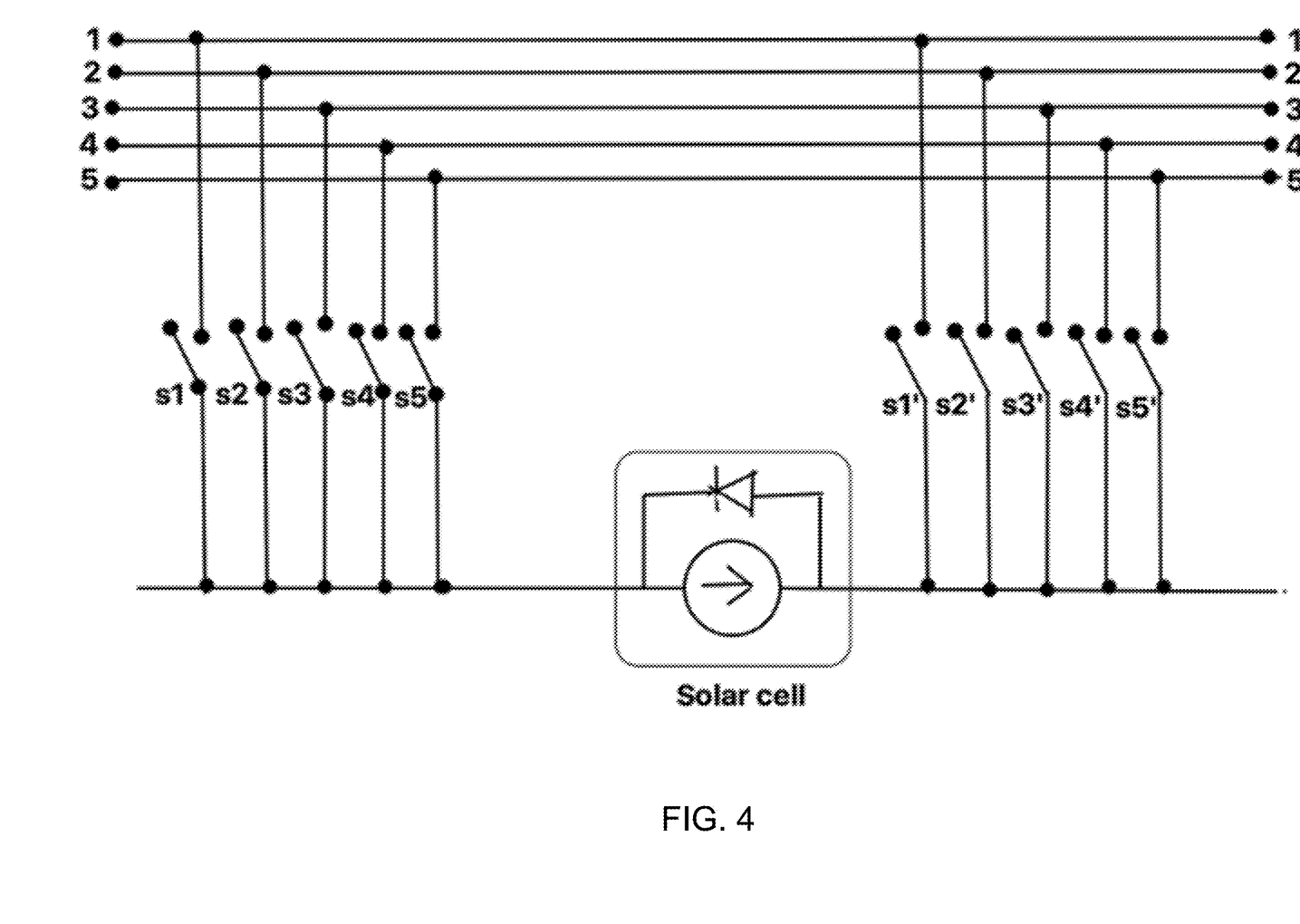
FIG. 4 illustrates an example switching circuit for creating solar cell strings.

A string of cells is illustrated in FIG. 3. The solar module 300 includes a plurality of cells 301. The cells electrically connected together in a string are illustrated by the dark line 302. The string has a beginning and ending connection point or terminal 303A and 303B, respectively. To connect or disconnect a cell from a string, the system provides switching circuits, as illustrated in FIG. 4, that allow the cell to be connected to one of a plurality of different strings by closing one or more switches associated with an electrical connection to another cell.

Since the cells are connected in series, a cell producing a power output that is significantly different than other cells will be detrimental to the total power output of the entire string. In other words, if one cell is producing a significantly lower power output than the remaining cells, the total string power output will be significantly reduced. Thus, it is desirable that all cells within the string have the same or similar irradiance values or illumination levels. Therefore, when the system is performing the dynamic clustering or grouping, the system attempts to connect cells within a string that have the same or similar irradiance level to the other cells within the string. The dynamic connection of the cells and determination of which cells should be connected can be calculated using simulation results, an optimization problem, and/or a clustering algorithm.

However, the number of strings within a solar module is bounded by a minimum number of strings and a maximum number of strings. The minimum number of strings is based upon the maximum allowable voltage of the hardware components, for example, the maximum allowable voltage of the DC/DC converter. In other words, the voltage produced by all the cells together must be less than the maximum allowable voltage of the DC/DC converter. Additionally, not every cell within the solar module can be on an independent circuit, because the cost of the hardware components to support and/or control each string would become too great. Accordingly, the system attempts to limit the number of strings to a minimum number that will still result in a maximum power output.

This maximum string determination can be performed offline and may be only performed a single time per solar structure, for example, when the solar structure is installed. To make the determination of the maximum number of strings, the system determines a statistical irradiance profile for the geographical region of the solar structure. In other words, the system determines a typical irradiance pattern for the geographical region. This irradiance pattern may be a pattern that is identified for a particular time frame, for example, a year irradiance pattern. The system then determines a variance of the statistical irradiance profile. In other words, the system identifies how much the irradiance profile varies during different times throughout a time period. Based upon the variance, the system can determine how many strings will be required to account for the variance. This number may then be used as the maximum number of strings. Alternatively, the system or a user may use the number of strings that account for the variance and add a safety factor, for example, ten strings in addition to the identified number of strings.

As stated above, the system is a dynamic system that can respond in real-time to changes in light angles. Therefore, after the reflectors have been positioned and/or the cells have been clustered, the system continuously monitors the position of the sun with respect to the solar structure at 102 and dynamically modifies the solar reflector angles, for example, at 103-105, and/or cells grouped within a string, for example, at 106, as the position of the sun with respect to the solar structure changes.

Figure 5:
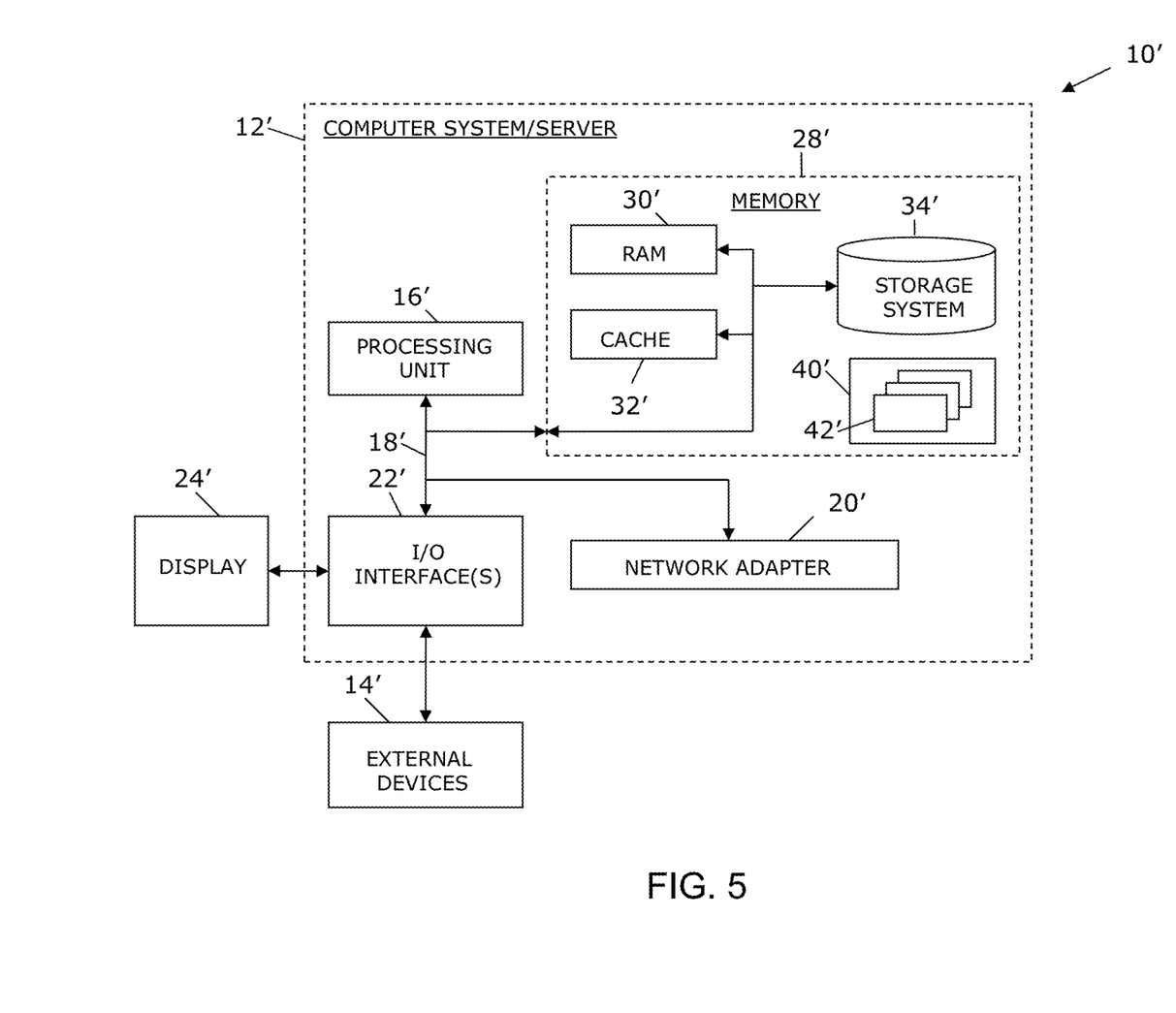
FIG. 5 illustrates a computer system.

As shown in FIG. 5, computer system/server 12' in computing node 10' is shown in the form of a general-purpose computing device. The components of computer system/server 12' may include, but are not limited to, at least one processor or processing unit 16', a system memory 28', and a bus 18' that couples various system components including system memory 28' to processor 16'. Bus 18' represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12' typically includes a variety of computer system readable media. Such media may be any available media that are accessible by computer system/server 12', and include both volatile and non-volatile media, removable and non-removable media.

System memory 28' can include computer system readable media in the form of volatile memory, such as random access memory (RAM) 30' and/or cache memory 32'. Computer system/server 12' may further include other removable/non-removable, volatile/non-volatile computer system storage media. By way of example only, storage system 34' can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18' by at least one data media interface. As will be further depicted and described below, memory 28' may include at least one program product having a set (e.g., at least one) of program modules that are configured to carry out the functions of embodiments of the invention.

Program/utility 40', having a set (at least one) of program modules 42', may be stored in memory 28' (by way of example, and not limitation), as well as an operating system, at least one application program, other program modules, and program data. Each of the operating systems, at least one application program, other program modules, and program data or some combination thereof, may include an implementation of a networking environment. Program modules 42' generally carry out the functions and/or methodologies of embodiments of the invention as described herein.

Computer system/server 12' may also communicate with at least one external device 14' such as a keyboard, a pointing device, a display 24', etc.; at least one device that enables a user to interact with computer system/server 12'; and/or any devices (e.g., network card, modem, etc.) that enable computer system/server 12' to communicate with at least one other computing device. Such communication can occur via I/O interfaces 22'. Still yet, computer system/server 12' can communicate with at least one network such as a local area network (LAN), a general wide area network (WAN), and/or a public network (e.g., the Internet) via network adapter 20'. As depicted, network adapter 20' communicates with the other components of computer system/server 12' via bus 18'. It should be understood that although not shown, other hardware and/or software components could be used in conjunction with computer system/server 12'. Examples include, but are not limited to: microcode, device drivers, redundant processing units, external disk drive arrays, RAID systems, tape drives, and data archival storage systems, etc.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method, comprising:
    receiving configuration input for a solar structure comprising (i) a solar module and (ii) a reflector array arranged around the periphery of the solar module in a non-rectangular configuration, wherein the reflector array comprises a plurality of solar reflectors whose orientation with respect to the solar module can be changed, wherein the reflectors of the reflector array arranged in a non-rectangular configuration produce a reflection profile where reflected light is reflected onto only the solar module;
    the configuration input comprising (i) a geographical location of the solar structure, (ii) module configuration input specifying dimensions of the solar module and the number of solar cells within the solar module, and (iii) reflector configuration input identifying the number of solar reflectors within the reflector array and dimensions of each of the solar reflectors;
    identifying the position of the sun relative to the solar structure;
    determining, for each solar reflector and based upon the identified position of the sun and the configuration input, an angle between the solar reflector and the solar module corresponding to a predetermined power gain for the solar module, wherein the determining comprises (i) for each of the solar reflectors, identifying the corresponding area of the solar module that is illuminated by the solar reflector and (ii) totaling the contributions from each of the solar reflectors to calculate an irradiance for each of the number of solar cells within the solar module;
    adjusting the angles of at least some of the solar reflectors with respect to the solar module to angles determined to correspond to the predetermined power gain using at least one actuator, coupled to each solar reflector, that provides actuation of the solar reflector in a direction fore and aft with respect to the solar module; and
    dynamically clustering, responsive to adjusting the at least some of the solar reflectors and based upon calculating the irradiance for each of the number of solar cells, the number of solar cells within the solar module into no more than a maximum number of a plurality of strings, wherein, within a given of the plurality of strings, each solar cell connected together within a given of the plurality of strings has an irradiance similar to that of other solar cells within the given string, wherein dynamically clustering comprises electrically connecting each solar cell within a given string together using switching circuits, wherein at least one of the plurality of strings comprises a set of solar cells having a non-linear path between a beginning connection point of the at least one of the plurality of strings and a terminal connection point of the at least one of the plurality of stings, wherein the maximum number of the plurality of strings is identified based upon a statistical irradiance profile for the geographical location.

2. The method of claim 1, wherein the determining comprises identifying the irradiance of the corresponding area of the solar module illuminated by the solar reflector.

3. The method of claim 2, wherein the determining comprises determining a harvested power for each of the number of solar cells in the solar module based upon the irradiance onto the cell.

4. The method of claim 1, wherein the determining is based upon the time of day and the time of year.

5. The method of claim 1, wherein the total irradiance for each of the number of solar cells comprises an ambient irradiance.

6. The method of claim 1, wherein the dynamically clustering comprises clustering the number of solar cells of the solar module into a number of strings that is (i) not more than a determined maximum number of strings and (ii) not less than a determined minimum number of strings.

7. The method of claim 6, wherein the determined maximum number of strings is determined by (i) determining a statistical irradiance profile for the geographical location of the solar structure, (ii) identifying a variance of the statistical irradiance profile, and (iii) determining a number of strings to account for the identified variance.

8. The method of claim 6, wherein the solar structure comprises electrical hardware that electrically controls a string and comprises a DC/DC converter, and wherein the determined minimum number of strings is based upon a maximum allowable voltage of the DC/DC converter of the string.

9. The method of claim 1, wherein the reflector array comprises one or more gaps between one or more of the plurality of reflectors.

10. The method of claim 1, wherein the solar structure comprises a circular solar structure.

11. An apparatus, comprising:
    at least one processor; and
    a computer readable storage medium having computer readable program code embodied therewith and executable by the at least one processor, the computer readable program code comprising:
    computer readable program code configured to receive configuration input for a solar structure comprising (i) a solar module and (ii) a reflector array arranged around the periphery of the solar module in a non-rectangular configuration, wherein the reflector array comprises a plurality of solar reflectors whose orientation with respect to the solar module can be changed, wherein the reflectors of the reflector array arranged in a non-rectangular configuration produce a reflection profile where reflected light is reflected onto only the solar module;
the configuration input comprising (i) a geographical location of the solar structure, (ii) module configuration input specifying dimensions of the solar module and a number of solar cells within the solar module, and (iii) reflector configuration input identifying the number of solar reflectors within the reflector array and dimensions of each of the solar reflectors;
computer readable program code configured to identify the position of the sun relative to the solar structure;
computer readable program code configured to determine, for each solar reflector and based upon the identified position of the sun and the configuration input, an angle between the solar reflector and the solar module corresponding to a predetermined power gain for the solar module, wherein the determining comprises (i) for each of the solar reflectors, identifying the corresponding area of the solar module that is illuminated by the solar reflector and (ii) totaling the contributions from each of the solar reflectors to calculate an irradiance for each of the number of solar cells within the solar module;
computer readable program code configured to adjust the angles of at least some of the solar reflectors with respect to the solar module to angles determined to correspond to the predetermined power gain using at least one actuator, coupled to each solar reflector, that provides actuation of the solar reflector in a direction fore and aft with respect to the solar module; and
computer readable program code configured to dynamically cluster, responsive to adjusting the at least some of the solar reflectors and based upon calculating the irradiance for each of the number of solar cells, the number of solar cells within the solar module into no more than a maximum number of a plurality of strings, wherein, within a given of the plurality of strings, each solar cell connected together within a given of the plurality of strings has an irradiance similar to that of other solar cells within the given string, wherein dynamically clustering comprises electrically connecting each solar cell within a given string together using switching circuits, wherein at least one of the plurality of strings comprises a set of solar cells having a non-linear path between a beginning connection point of the at least one of the plurality of strings and a terminal connection point of the at least one of the plurality of stings, wherein the maximum number of the plurality of strings is identified based upon a statistical irradiance profile for the geographical location.

12. A computer program product, comprising:
a computer readable storage medium having computer readable program code embodied therewith, the computer readable program code executable by a processor and comprising:
computer readable program code configured to receive configuration input for a solar structure comprising (i) a solar module and (ii) a reflector array arranged around the periphery of the solar module in a non-rectangular configuration, wherein the reflector array comprises a plurality of solar reflectors whose orientation with respect to the solar module can be changed, wherein the reflectors of the reflector array arranged in a non-rectangular configuration produce a reflection profile where reflected light is reflected onto only the solar module;
the configuration input comprising (i) a geographical location of the solar structure, (ii) module configuration input specifying dimensions of the solar module and a number of solar cells within the solar module, and (iii) reflector configuration input identifying the number of solar reflectors within the reflector array and dimensions of each of the solar reflectors;
computer readable program code configured to identify the position of the sun relative to the solar structure;
computer readable program code configured to determine, for each solar reflector and based upon the identified position of the sun and the configuration input, an angle between the solar reflector and the solar module corresponding to a predetermined power gain for the solar module, wherein the determining comprises (i) for each of the solar reflectors, identifying the corresponding area of the solar module that is illuminated by the solar reflector and (ii) totaling the contributions from each of the solar reflectors to calculate an irradiance for each of the number of solar cells within the solar module;
computer readable program code configured to adjust the angles of at least some of the solar reflectors with respect to the solar module to angles determined to correspond to the predetermined power gain using at least one actuator, coupled to each solar reflector, that provides actuation of the solar reflector in a direction fore and aft with respect to the solar module; and
computer readable program code configured to dynamically cluster, responsive to adjusting the at least some of the solar reflectors and based upon calculating the irradiance for each of the number of solar cells, the number of solar cells within the solar module into no more than a maximum number of a plurality of strings, wherein, within a given of the plurality of strings, each solar cell connected together within a given of the plurality of strings has an irradiance similar to that of other solar cells within the given string, wherein dynamically clustering comprises electrically connecting each solar cell within a given string together using switching circuits, wherein at least one of the plurality of strings comprises a set of solar cells having a non-linear path between a beginning connection point of the at least one of the plurality of strings and a terminal connection point of the at least one of the plurality of stings, wherein the maximum number of the plurality of strings is identified based upon a statistical irradiance profile for the geographical location.

13. The computer program product of claim 12, wherein the determining comprises identifying the irradiance of the corresponding area of the solar module illuminated by the solar reflector.

14. The computer program product of claim 13, wherein the determining comprises determining a harvested power for each cell in the solar module based upon the irradiance onto the cell.

15. The computer program product of claim 12, wherein the determining is based upon the time of day and the time of year.

16. The computer program product of claim 12, wherein the total irradiance for each of the number of solar cells comprises an ambient irradiance.

17. The computer program product of claim 12, wherein the dynamically changing comprises clustering the number of solar cells of the solar module into a number of strings that is (i) not more than a determined maximum number of strings and (ii) not less than a determined minimum number of strings.

18. The computer program product of claim 17, wherein the determined maximum number of strings is determined by (i) determining a statistical irradiance profile for the geographical location of the solar structure, (ii) identifying a variance of the statistical irradiance profile, and (iii) determining a number of strings to account for the identified variance.

19. The computer program product of claim 17, wherein solar structure comprises electrical hardware that electrically controls a string and comprises a DC/DC converter, and wherein the determined minimum number of strings is based upon a maximum allowable voltage of the DC/DC converter of the string.

20. A method, comprising:
  determining an angle for each of a plurality of solar reflectors with respect to a solar module comprising a plurality of cells, wherein the plurality of solar reflectors are arranged around the periphery of the solar module in a circular configuration, wherein the determined angle for each solar reflector corresponds to a predetermined harvested irradiance for each of the plurality of cells, wherein the plurality of solar reflectors arranged in a circular configuration produce a reflection profile where light from one of the plurality of solar reflectors is reflected onto at least one of the plurality of cells, thereby improving the ground coverage ratio of the solar module;
  the determining comprising determining a harvested irradiance for each of the plurality of cells by (i) identifying the corresponding area of the solar module that is illuminated by each solar reflector, (ii) identifying cells from the plurality of cells illuminated by the corresponding area, and (iii) calculating, for each of the plurality of cells, a reflected irradiance by totaling the irradiance contributions from each solar reflector; and
  dynamically adjusting, responsive to determining the harvested irradiance for each of the plurality of cells, the electrical connections of the plurality of cells to form no more than a maximum number of a plurality of strings, wherein, within a given of the plurality of strings, each cell in a given string has a reflected irradiance similar to that of other cells within the given string, wherein the dynamically adjusting comprises determining a number of strings to be used in the solar module (i) not exceeding a maximum number of strings and (ii) not less than a minimum number of strings, wherein dynamically adjusting comprises electrically connecting each cell in a given string together using switching circuits, wherein at least one of the plurality of strings comprises a set of cells having a non-linear path between a beginning connection point of the at least one of the plurality of strings and a terminal connection point of the at least one of the plurality of stings, wherein the maximum number of the plurality of strings is identified based upon a statistical irradiance profile for a geographical location of the solar module.

* * * * *